United States Patent
Uehara

(10) Patent No.: US 7,362,403 B2
(45) Date of Patent: Apr. 22, 2008

(54) LIQUID CRYSTAL DISPLAY HAVING GATE DRIVER IC CHIP COG-MOUNTED ON GLASS SUBSTRATE

(75) Inventor: Takuya Uehara, Osaka (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 143 days.

(21) Appl. No.: 11/045,809

(22) Filed: Jan. 28, 2005

(65) Prior Publication Data

US 2005/0189594 A1    Sep. 1, 2005

(30) Foreign Application Priority Data

Jan. 30, 2004    (JP)    ............ P.2004-024507

(51) Int. Cl.
    *H01L 33/00*    (2006.01)
(52) U.S. Cl. .............. 349/150; 345/204; 257/E33.055
(58) Field of Classification Search ........ 349/149–152; 257/59, 72, E33.055; 345/204–206
    See application file for complete search history.

(56) References Cited

U.S. PATENT DOCUMENTS

| | | | |
|---|---|---|---|
| 6,617,612 B2 * | 9/2003 | Zhang et al. ............... | 257/59 |
| 6,917,408 B2 * | 7/2005 | Nishino ...................... | 349/149 |
| 6,924,794 B2 * | 8/2005 | Moon .......................... | 345/204 |

FOREIGN PATENT DOCUMENTS

| | | |
|---|---|---|
| JP | 4-34418 | 2/1992 |
| JP | 6-250202 | 9/1994 |
| JP | 2000-19549 | 1/2000 |
| JP | 2001-56477 | 2/2001 |
| JP | 2001-313308 | 11/2001 |
| JP | 2002-357807 | 12/2002 |

OTHER PUBLICATIONS

Patent Abstracts of Japan, Publication No. 2002-357807, Publication Date Dec. 13, 2002, 2 pages.
Japanese Office Action dated Jan. 12, 2007 for Japanese Application No. 2004-024507 (5 pages).

* cited by examiner

*Primary Examiner*—Marcos D. Pizarro
(74) *Attorney, Agent, or Firm*—Osha Liang LLP

(57) ABSTRACT

Source driver IC chips 3 are mounted on flexible substrates 7a and 7b. A source input pattern, to which a source driver signal is inputted, and a source output pattern, from which a source drive signal is outputted, are formed on the flexible substrates 7a and 7b. An end portion of the source input pattern is connected to a printed circuit board 5. Moreover, an end portion of the source output pattern is connected to a glass substrate 2. A gate driver transmission pattern for transmitting gate driver signals, which are outputted from a signal processing IC 4, to the glass substrate 2 is formed on the flexible substrate 7a. In this liquid display apparatus, a gate driver IC chip 6, which is formed by using monocrystalline silicon and has a gate driver circuit integrated thereon, is COG-mounted on the glass substrate 2.

1 Claim, 7 Drawing Sheets

LIQUID CRYSTAL DISPLAY HAVING GATE DRIVER IC CHIP COG-MOUNTED ON GLASS SUBSTRATE

BACKGROUND OF THE INVENTION

1. Field of the Invention

The present invention relates to a liquid crystal display having a display panel portion, on which thin film transistors are formed by using amorphous silicon, and also having a flexible substrate, on which source driver IC chips for driving the sources of the thin film transistors are mounted.

2. Description of the Related Art

In a liquid crystal display using an active matrix type display panel, thin film transistors (hereunder referred to as TFTs) respectively associated with pixel electrodes are driven by using gate drivers and source drivers thereby to display images. FIG. 8 shows the aforementioned liquid crystal display, which has a signal processing IC 4 mounted on a printed circuit board 5b and which has source driver IC chips 3 mounted on flexible substrates 7b and 7c and also has gate driver IC chips 6 mounted on flexible substrates 99.

Further, source driver signals generated by the signal processing IC 4 are introduced to the source driver IC chips 3 through a pattern formed on a printed circuit board 5b and those formed on flexible substrates 7b and 7c. Furthermore, source drive signals generated at the source driver IC chip 3 are introduced to the sources of the TFTs through the patterns formed on the flexible substrates 7b and 7c and the pattern formed on the glass substrate 2b.

Additionally, gate driver signals generated at the signal processing IC 4 are introduced to gate driver IC chips 6 through the pattern formed on the printed circuit substrate 5b, that formed on the flexible substrate 7c, that formed on the glass substrate 2b, and that formed on the flexible substrate 99. Besides, gate drive signals generated at the gate driver IC chip 6 are introduced to the gates of the TFTs through the pattern formed on the flexible substrate 99 and that formed on the glass substrate 2b.

That is, the gate driver IC chips 6 are configured by being mounted on the flexible substrates 99, respectively. Thus, the gate drive signals generated by the gate driver IC chips 6 are sent toward parts provided at the side of the glass substrate 2b according to the gate driver signals sent from the parts provided at the side of the glass substrate 2b toward those provided at the side of the flexible substrates 99. That is, on the flexible substrates 99, signal flows are turned back at the gate driver IC chips 6 serving as turning points. The reason for adapting the signal flow to be turned back in this manner is that the integration of the gate driver circuit on the glass substrate 2b is difficult in the case of using amorphous signal that enables the formation of the glass substrate 2b at a temperature being lower than a temperature in the case of forming polysilicon TFTs, and that it is, therefore, necessary to use the gate driver IC chips 6 formed of monocrystal silicon (this technique is referred to as a first conventional technique).

Further, another conventional technique (hereunder referred to as a second conventional technique) described hereinbelow has been proposed. That is, it has been disclosed that according to this technique, gate drivers are formed on a glass substrate, on which pixel electrodes and TFTs adapted to switch paths for transmitting signals to the pixel electrodes are formed, by using polysilicon TFTS. Also, it has been disclosed (see, for example, JP-A-2002-357807 (specifically, on paragraphs [0002] and [0011])) that via-electrodes for transmitting gate driver signals, which are outputted from an LCD controller mounted on a printed circuit board, to gate drivers provided on the glass substrate are formed, together with patterns for signals inputted to and outputted from source drivers, on films for TAB (Tape Automated Bonding) of source drivers.

SUMMARY OF THE INVENTION

However, in the case of employing the first conventional technique, the following problems have arisen. That is, the gate driver IC chips 6 are mounted on the flexible substrates 99. Thus, there is the necessity for providing complex signal paths, through each of which the gate driver signal generated at the signal processing IC 4 is transmitted from the part provided at the side of the glass substrate 2b through the pattern formed on the flexible substrate 99 to the gate driver chip 6, and which the gate drive signal generated at the gate driver IC chip 6 is transmitted to the part provided at the side of the glass substrate 2b through the pattern formed on the flexible substrate 99. Consequently, failures, such as breaking of the signal path, are liable to occur. Additionally, the necessity for the flexible substrates 99 has resulted in increase in the number of components and the cost price of the components.

The second conventional technique is disclosed as being the technique adapted so that the gate drivers are formed on the glass substrate by using polysilicon TFTs. On the other hand, in the case of forming TFTs by using amorphous silicon, it is difficult to form the gate drivers on the glass substrate by using TFTS. Thus, from the viewpoint of solving the problems having arisen from the first conventional technique, that is, the problems that because the flexible substrates, on each of which the gate driver IC chip is mounted, is needed in a case where the gate drivers are constituted by the gate driver IC chips formed by using monocrystalline silicon, failures, such as breaking of the signal path, are liable to occur, and that the necessity for the flexible substrates has resulted in increase in the number of components and the cost price of the components, the second conventional technique is difficult to apply.

The invention is created to solve the aforementioned problems. Accordingly, one of objects of the invention is to provide a liquid crystal display enabled to eliminate the necessity for the flexible substrates, on each of which the gate driver IC chip is mounted, and to reduce the impedance of a path, which supplies DC power to each of the gate driver IC chips, to a sufficiently low value even in a case where patterns connected to each other through an anisotropic conductive film are arranged at equal intervals and adapted to have a same shape so as to prevent an occurrence of uneven heating during thermocompression-bonding thereof.

Another object of the invention is to provide a liquid crystal display enabled to eliminate the necessity for the flexible substrates, on each of which the gate driver IC chip is mounted, by COG-mounting gate driver IC chips, which are formed of monocrystalline silicon, on glass substrates on each of which a gate driver IC chip is mounted.

According to a first aspect of the invention, there is provided a liquid crystal display including: a display panel portion having a glass substrate on which pixel electrodes are formed and on which thin film transistors respectively associated with the pixel electrodes are formed by amorphous silicon; a gate driver IC chip formed by monocrystalline silicon, and in which a gate driver circuit that generates gate drive signals for driving gates of the thin film transistors, is integrated; a source driver IC chip in which a source driver circuit that generates source drive signals for driving sources of the thin film transistors, is integrated; a signal processing IC, in which at least a display controller for generating and outputting gate driver signals that are inputted to the gate driver circuit, and source driver signals that are inputted to said source driver IC chip, is integrated; a printed circuit board on which the signal processing IC is mounted; a flexible substrate on which the source driver IC chip is mounted, the flexible substrate on which a source input pattern to which the source driver signals are inputted, and a source output pattern from which the source drive signals are outputted, are formed, so that an end portion of the source input pattern is connected to the printed circuit board, and that an end portion of the source output pattern is connected to the glass substrate, wherein a gate driver transmission pattern for transmitting gate driver signals that are outputted from the signal processing IC to the glass substrate is formed on the flexible substrate, wherein the gate driver IC chip is COG-mounted on the glass substrate, wherein a unit input pattern portion and a unit output pattern portion are formed on the flexible substrate, the unit input pattern portion electrically connected to a printed-circuit-board-side pattern that is formed on the printed circuit board through an anisotropic conductive film, and the unit output pattern portion electrically connected to a glass-substrate-side pattern that is formed on the glass substrate through an anisotropic conductive film, wherein each of the gate driver transmission patterns is constituted by one unit input pattern portion, one unit output pattern portion, and a connecting pattern portion for connecting the one unit input pattern portion to the one unit output pattern portion, and wherein a power supply pattern serving as a path for DC power inputted to the gate driver circuit is constituted by plural unit input pattern portions, plural unit output pattern portions, and a unit output pattern portion for connecting the plural unit input pattern portions to the plural unit output patter portions.

According to a second aspect of the invention, there is provided a liquid crystal display including: a display panel portion having a glass substrate on which pixel electrodes are formed and on which thin film transistors respectively associated with the pixel electrodes are formed by amorphous silicon; a gate driver IC chip formed by monocrystalline silicon, and in which a gate driver circuit that generates gate drive signals for driving gates of the thin film transistors, is integrated; a source driver IC chip in which a source driver circuit that generates source drive signals for driving sources of the thin film transistors, is integrated; a signal processing IC, in which at least a display controller for generating and outputting gate driver signals that are inputted to the gate driver circuit, and source driver signals that are inputted to said source driver IC chip, is integrated; a printed circuit board on which the signal processing IC is mounted; a flexible substrate on which the source driver IC chip is mounted, the flexible substrate on which a source input pattern to which the source driver signals are inputted, and a source output pattern from which the source drive signals are outputted, are formed, so that an end portion of the source input pattern is connected to the printed circuit board, and that an end portion of the source output pattern is connected to the glass substrate, wherein a gate driver transmission pattern for transmitting gate driver signals that are outputted from the signal processing IC to the glass substrate is formed on the flexible substrate, and wherein the gate driver IC chip is COG-mounted on the glass substrate.

BRIEF DESCRIPTION OF THE DRAWINGS

The above objects and advantages of the present invention will become more apparent by describing preferred exemplary embodiments thereof in detail with reference to the accompanying drawings, wherein.

DETAILED DESCRIPTION OF THE PREFERRED EMBODIMENTS

Referring now to the accompanying drawings, a description will be given in detail of preferred embodiments of the invention.

Figure 1:
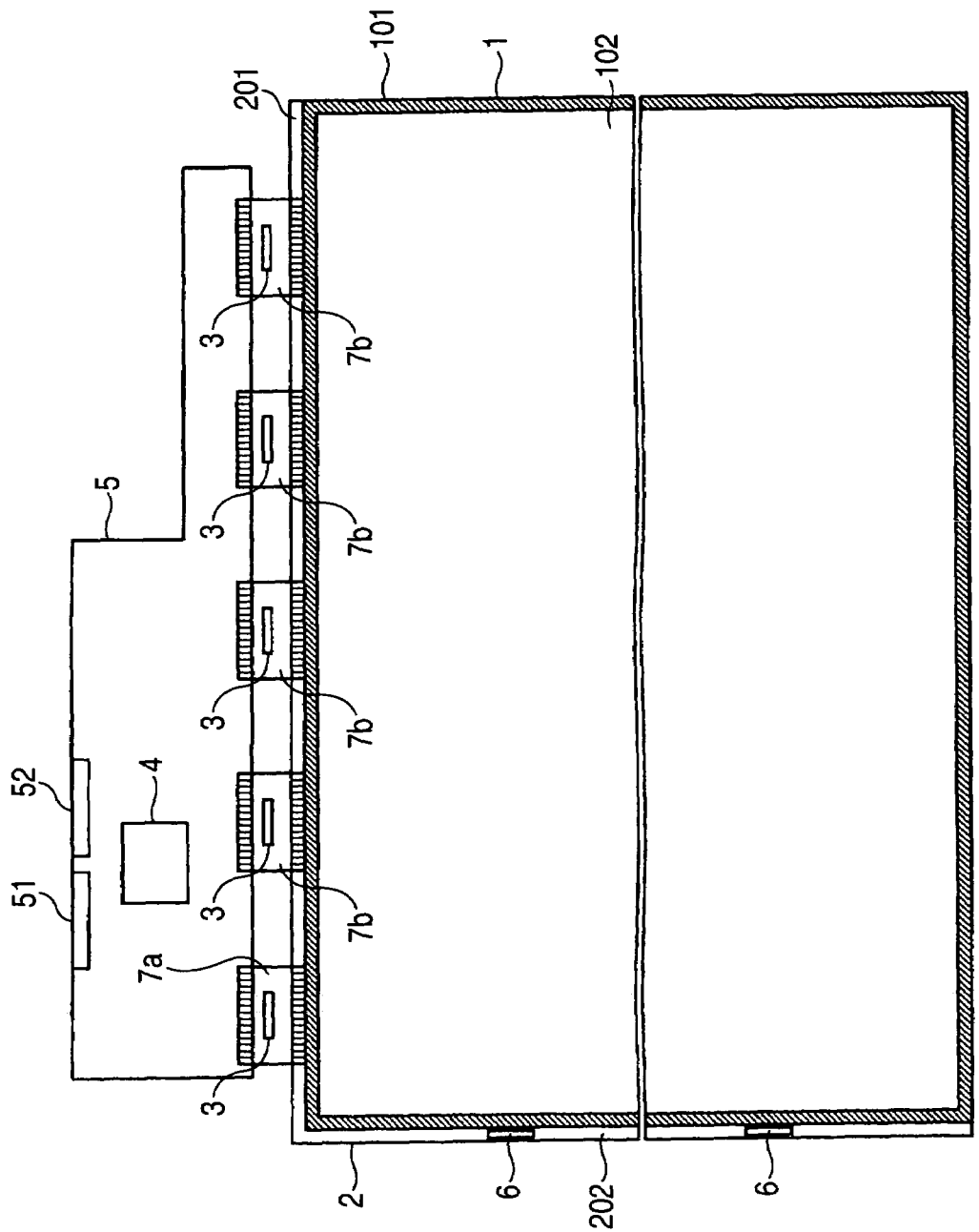
FIG. 1 is an explanatory view illustrating the outline of the configuration of an embodiment of a liquid crystal display according to the invention.
Figure 2:
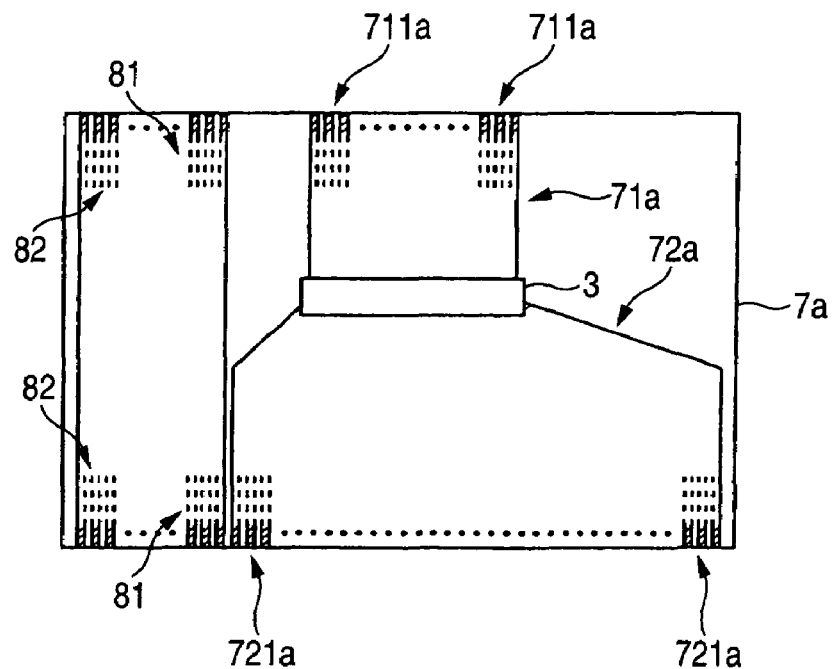
FIG. 2 is an explanatory view illustrating the outline of patterns formed on a flexible substrate, on which a source driver IC is mounted and which a signal path and a DC power supply path for the gate driver IC chip are formed.
Figure 3:
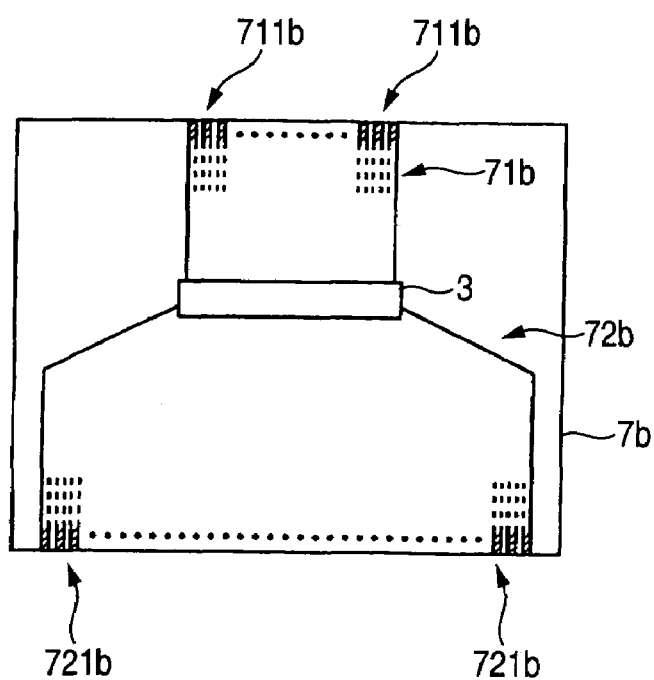
FIG. 3 is an explanatory view illustrating the outline of a pattern formed on a flexible substrate, on which a source driver IC is mounted.
Figure 4:
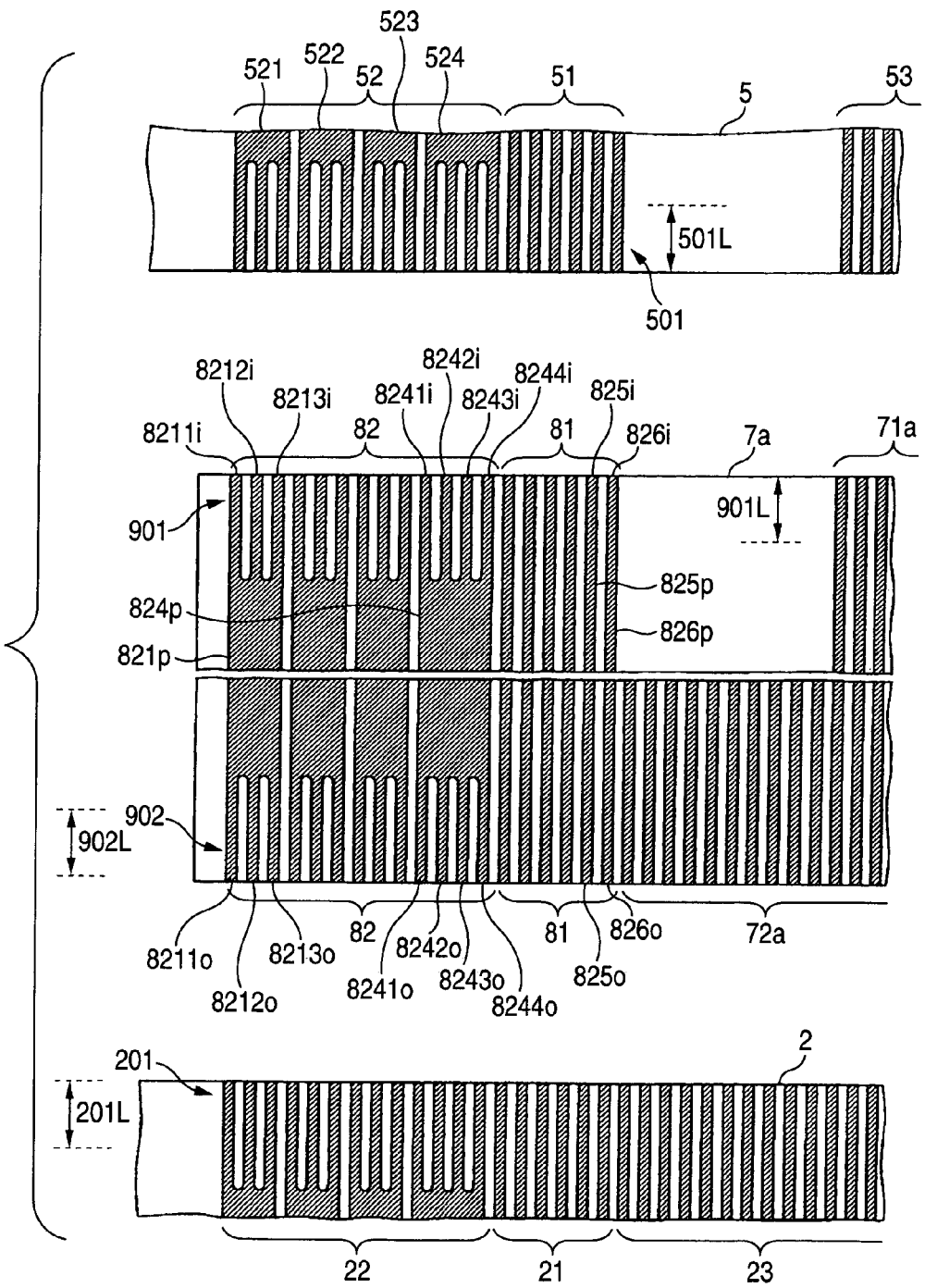
FIG. 4 is an explanatory view illustrating the detail of patterns formed on a flexible substrate, on which a source driver IC is mounted and which a signal path and a DC power supply path for the gate driver IC chip are formed.
Figure 7:
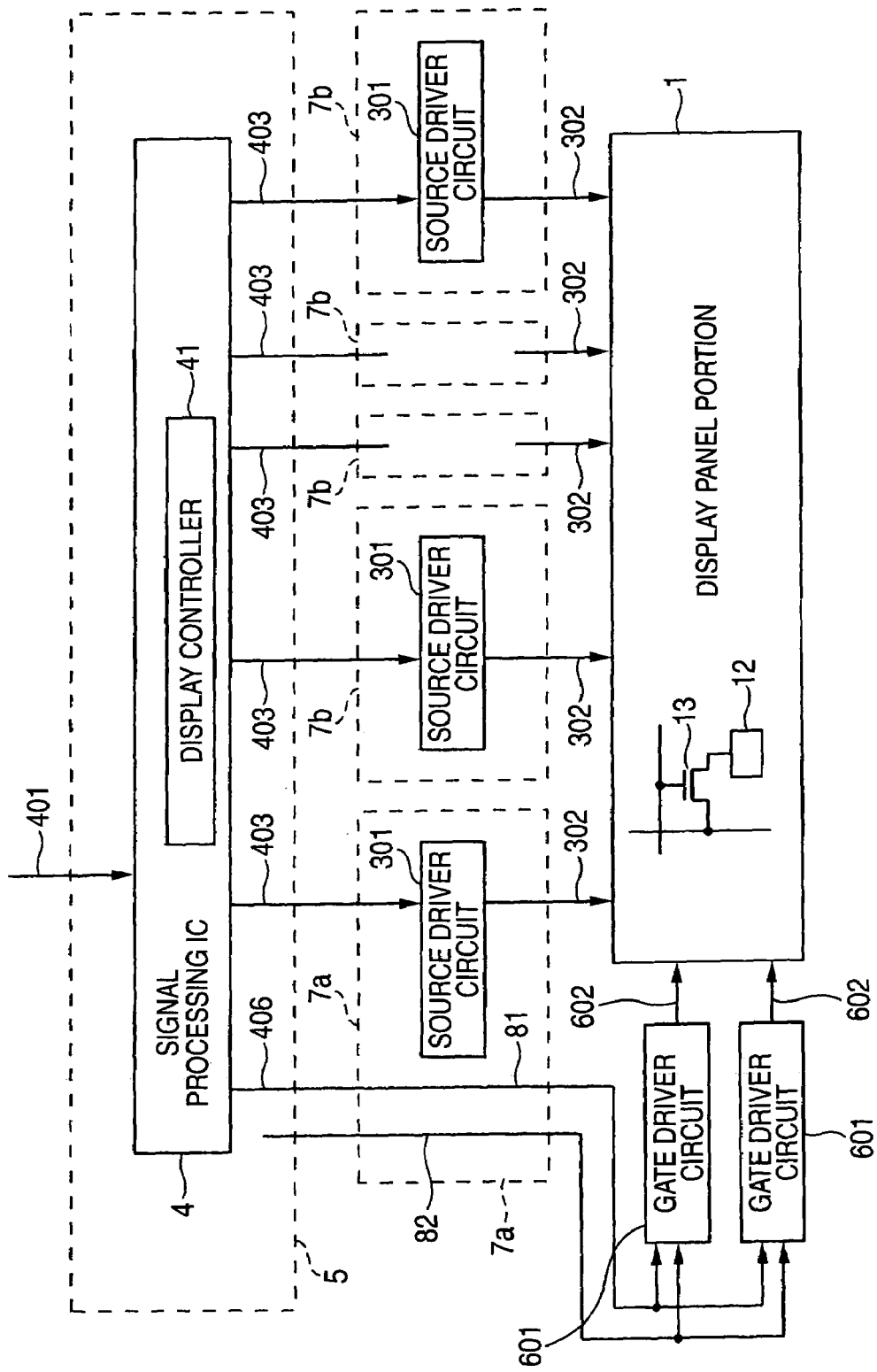
FIG. 7 is a block diagram illustrating the electrical configuration of the embodiment.
Figure 8:
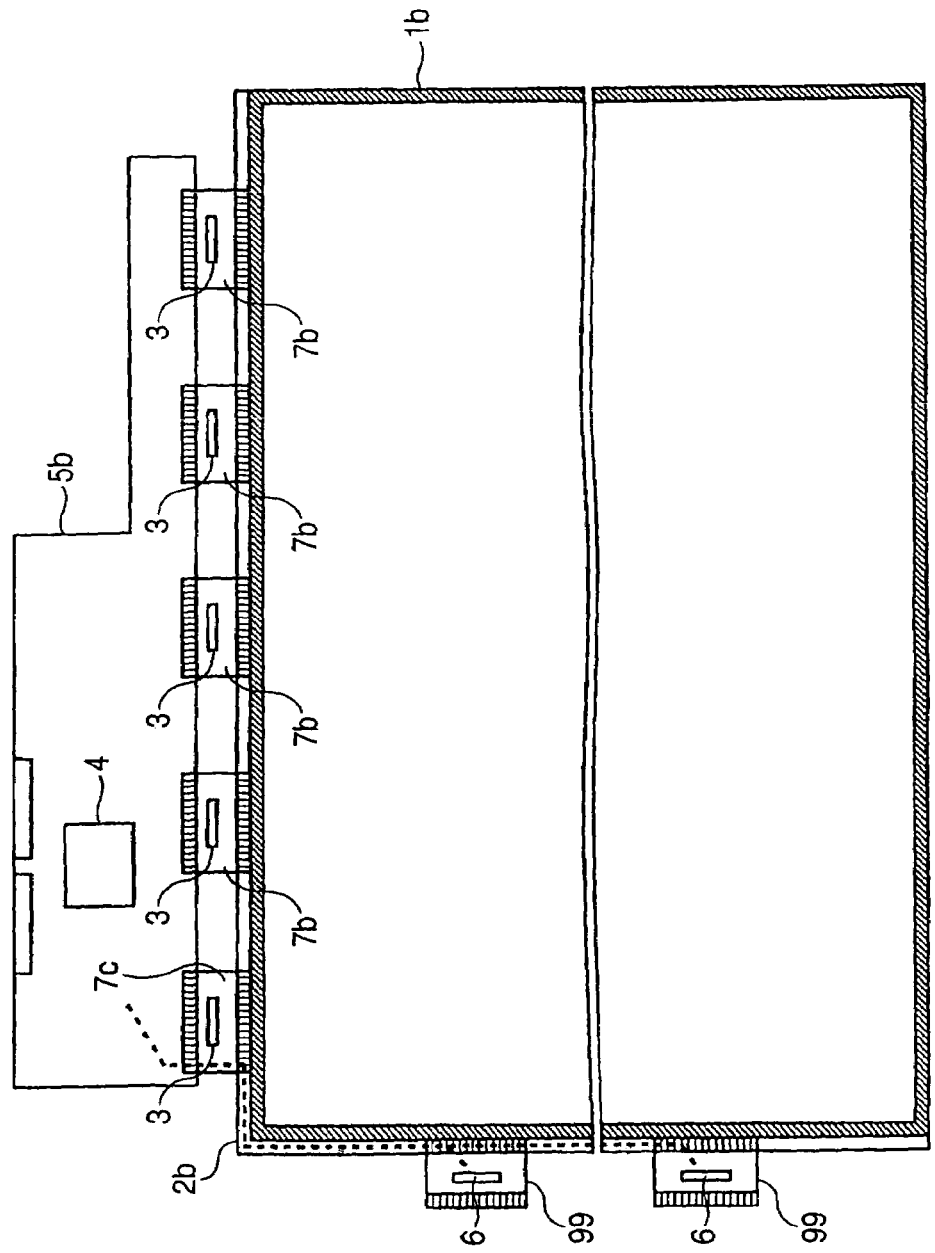
FIG. 8 is an explanatory view illustrating the outline of the configuration of a conventional apparatus.

FIG. 1 is an explanatory view illustrating the outline of the configuration of an embodiment of the liquid crystal display according to the invention. Parts thereof, which are the same as constituents shown in FIG. 8, are designated by the same characters as those used for designating the constituents. FIGS. 2 and 3 are explanatory views illustrating the outline of patterns formed on a flexible substrate, on which a source driver IC chip is mounted. FIG. 4 is an explanatory view illustrating the detail shapes of the patterns formed on the flexible substrate, on which the source driver IC chip is mounted. FIG. 7 is a block diagram illustrating the electrical configuration of the embodiment.

In the figures, a display panel portion 1, whose shape in plan view is rectangular, is an active matrix display and has two glass substrates facing each other across a liquid crystal. One of the two glass substrates 2 is formed in such a way as to have a size so that this substrate 2 protrudes from the left side and the top side of a body 101 of the display panel portion 1, as viewed in FIG. 1.

Flexible substrates 7a and 7b, on each of which a source driver IC chip 3 is mounted, are connected (by TAB (Tape Automated Bonding) to a top-side projection portion 201 of the glass substrate 2. Furthermore, a gate driver IC chip 6 constituted by monocrystalline silicon is COG (Chip On Glass)-mounted on a left-side projection portion 202 of the glass substrate 2.

Pixel electrodes 12 arranged in a matrix in a range overlapping with a display area 102 of the display panel portion 1 are formed on the glass substrate 2. Thin film transistors 13 respectively associated with the pixel electrodes 12 are formed thereon by using amorphous silicon.

The other glass substrate (not shown) is adapted so that the planar shape thereof has a size, which is substantially equal to that of the body 101 of the display panel portion 1. A common electrode is formed on a surface of this substrate, which faces the glass substrate 2.

The signal IC 4 mounted on the printed circuit board 5 has an A/D converter, a Y/C separation circuit, a signal processing circuit, a scaling circuit (these four circuits are not shown) and a liquid crystal display controller 41. The liquid crystal display controller 41 generates and outputs gate driver signals 406, which are inputted to a gate driver circuit 601, and source driver signals 403, which are inputted to a source driver circuit 301. That is, the signal processing IC 4 generates and outputs a gate driver signal 406 and a source driver signal 403 by performing predetermined processing on analog video signals 401 inputted thereto through a connector 51 (a connector 52 is used for inputting and so on of other signals).

The gate driver circuit 601 is formed of monocrystalline silicon and is integrated in a gate driver IC chip 6 COG-mounted on the glass substrate 2. Further, the gate driver circuit 601 generates and outputs gate drive signals 602, which are used for driving the gate of the TFT 13 formed on the glass substrate 2, according to the gate driver signal 406 outputted from the signal processing IC 4. The source driver circuit 301 is integrated in the source driver IC chip 3. Further, the source driver circuit 301 generates and outputs source drive signals 302, which are used for driving the source of the TFT 13, according to the source driver signal 403 outputted from the signal processing IC 4.

Incidentally, as shown in FIG. 3, a source input pattern 71b, to which the source driver signals 403 are inputted, and a source output pattern 72b, from which the source drive signals 302 are outputted, are formed on the flexible substrate 7b. Further, a substrate-edge-side end portion 711b of the source input pattern 71b is connected to a pattern formed on the printed circuit board 5 through an anisotropic conductive film. Furthermore, a substrate-edge-side end portion 721b of the source output pattern 72b is connected to a pattern formed on the pattern formed on the glass substrate 2 through an anisotropic conductive film.

As shown in FIG. 2, a source input pattern 71a, to which source driver signals 403 are inputted, and a source output pattern 72a, from which source drive signals 302 are outputted, are formed on a flexible substrate 7a. A substrate-edge-side end portion 711a of the source input pattern 71a is connected to a pattern 53 formed on the printed circuit board 5 through an anisotropic conductive film. A substrate-edge-side end portion 721b of the source output pattern 72b is connected to a pattern 23 formed on the glass substrate 2 through an anisotropic conductive film.

A gate driver transmission pattern 81 for transmitting the gate driver signals 406, which are outputted from the signal processing IC 4, to the glass substrate 2 is formed on the flexible substrate 7a. A power supply pattern 82 for transmitting DC power, which is sent from the printed circuit board 5 and serves as operating power for the gate driver circuit 601, to the glass substrate 2 is formed thereon.

Hereinafter, the gate driver transmission pattern 81 and the power supply pattern 82 are described in detail.

Figure 6:
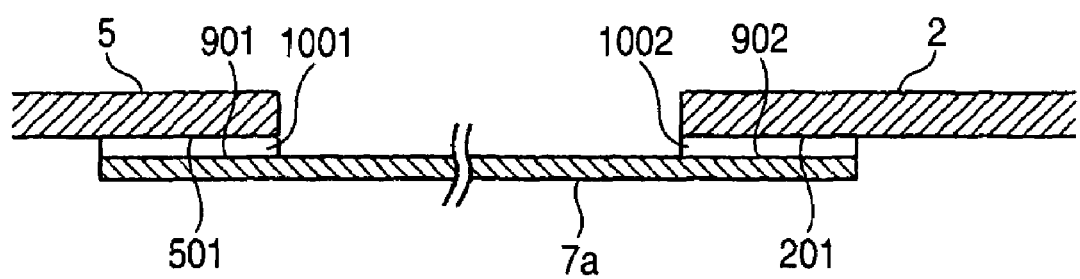
FIG. 6 is an explanatory view illustrating a printed circuit board, a flexible substrate, and a glass substrate, which are electrically connected by anisotropic conductive films.

Among patterns 81 and 82 shown in FIG. 4, those provided in a range associated with a range 901L constitute a unit input pattern portion 901 serving as that described in the claims. As shown in FIG. 6, this unit input pattern portion 901 is connected to an end portion 501 of each of printed-circuit-board-side patterns 51 and 52 (patterns provided in a range associated with a range 501 L among the patterns 51 and 52) formed on the printed circuit board 5 through an anisotropic conductive film 1001.

Among the patterns designated by reference numerals 81 and 82, those provided in a range associated with a range 902L constitute a unit output pattern portion 902 serving as that described in the claims. Additionally, this unit output pattern portion 902 is connected to an end portion 201 of each of glass-substrate-side patterns 21 and 22 (patterns provided in a range associated with a range 201L among those 21 and 22), which are formed on the glass substrate 2, through an anisotropic conductive film 1002.

Incidentally, the aforementioned unit input pattern portions 901 are patterns formed at uniform intervals in such a way as to have the same width. This aims at preventing occurrence of uneven heating during thermocompression-bonding of the patterns is performed when the unit input pattern portion 901 is electrically connected to the end portion 501 of each of the printed-circuit-board-side patterns 51 and 52 through the anisotropic conductive film 1001 (incidentally, in a case where the patterns to be thermocompression-bonded differ in width from one another or are formed at uneven intervals, uneven heat conduction occurs, so that poor connection therebetween are liable to occur. Further, for a similar reason, the unit output pattern portions 902 are patterns formed at uniform intervals in such a way as to have the same width (to correspond to the shapes of these patterns, the pattern end portions 501 and 201 are set to be patterns formed at uniform intervals in such a way as to have the same width).

Hereunder, the gate driver signal 406 is described. The gate driver signal 406 comprises plural control signals and clock signals that indicate operating timing. Further, the control signals and the clock signals are transmitted from the part provided at the side of the printed circuit board 5 to that provided at the side of the glass substrate 2 through constituent patterns of the gate driver transmission patterns 81. Thus, the gate driver transmission patterns 81 are constituted by one of the unit input pattern portions (for example, 825i or 826i), one of the unit output pattern portions (for instance, 825o or 826o), and a connecting pattern portion (for example, 825p or 826p) for connecting the one of the unit input pattern portions to the one of the unit output pattern portions.

The DC power introduced to the gate driver circuit 601 is described hereinbelow. The DC power supply includes three kinds of DC power sources, that is, a 3.3V DC power source for a digital circuit, a (–6V) DC power source for turning off the TFT 13, and a 25V DC power source for turning on the TFT 13. Thus, the power supply pattern 82 is a pattern comprising four paths, that is, three paths respectively associated with the three kinds of DC power supplies and a 0V path indicating a ground level. Each of the paths is formed of plural unit input pattern portions 901, plural unit output pattern portions 902 and a connecting pattern portion each for connecting the plural unit input pattern portions 901 to the plural unit output pattern portions 902.

Thus, for example, the path for the 25V DC power, which is provided in the power supply pattern 82, is formed of three unit input pattern portions 8211i to 8213i, three unit output pattern portions 8211o to 8213o, and a connecting pattern portion 821p for connecting the three unit input pattern portions 8211i thru 8213i to the three unit output pattern portions 8211o thru 8213o. Further, the 0V path in the power supply pattern 82 is formed of four unit input pattern portions 8241i thru 8244i, four unit output pattern portions 8241o thru 8244o, and a connecting pattern portion 824p for connecting the four unit input pattern portions 8241*i* thru 8244*i* to the four unit output pattern portions 8241*o* thru 8244*o*.

Similarly, in the power supply pattern 82, each of the path for the 3.3V DC power, and the path for the (−6V) DC power is formed of three unit input pattern portions, three unit output pattern portions, and a connecting pattern portion for connecting the three unit input pattern portions to the three unit output pattern portions.

Incidentally, on the printed circuit board 5, a pattern 521 is used as a path for the 2.5V DC power. A pattern 522 is used as a path for the (−6V) DC power. A pattern 523 is used as a path for the 3.3 V DC power. A pattern 524 is used as the 0V path. A pattern 51 is used as a path for the gate driver signal 406. A pattern 53 is used as a path for the source driver signal 403. Further, on the glass substrate 2, a pattern 22 is used as a path for the DC power. A pattern 21 is used as a path for the gate driver signal 406. Moreover, a pattern 23 is used as a path for the source drive signal 302.

Figure 5:
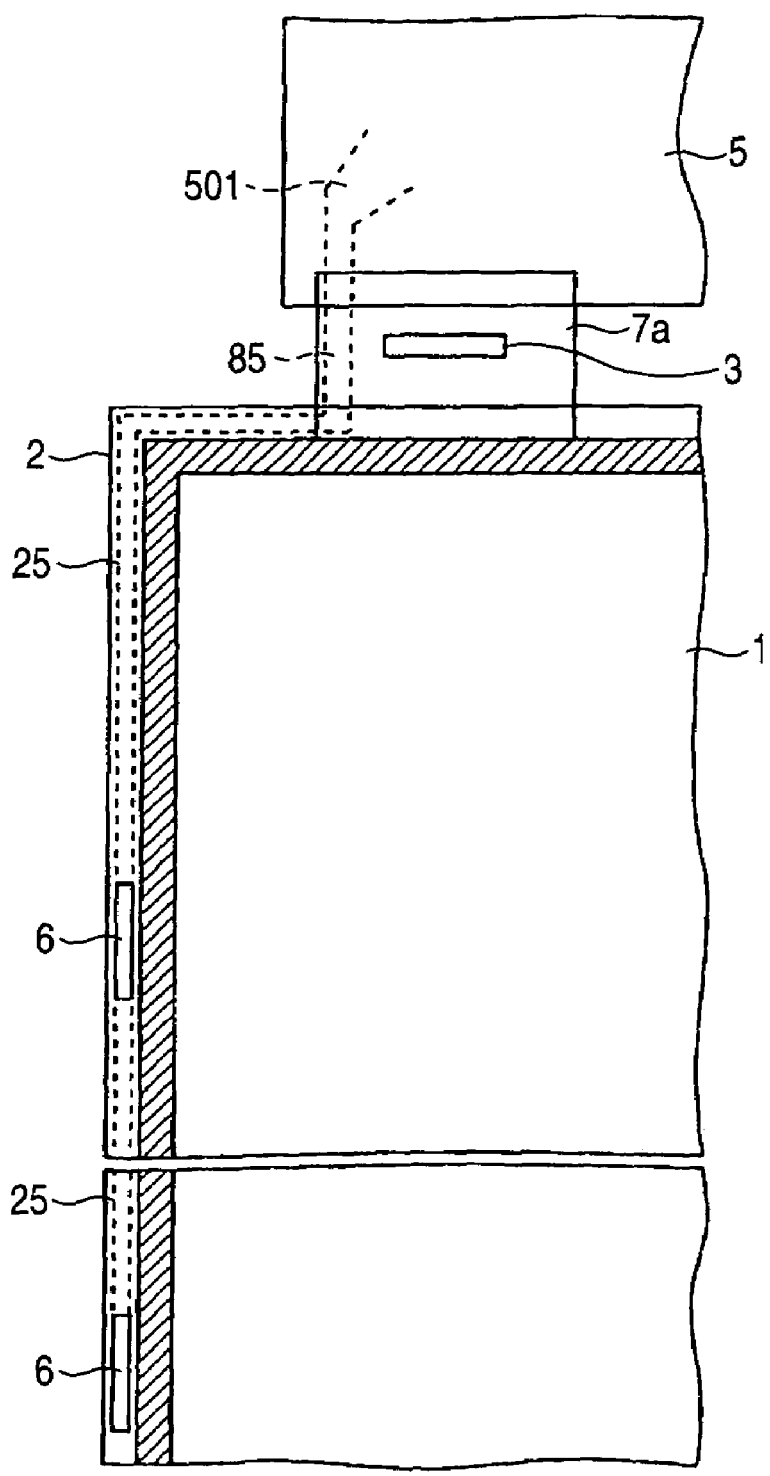
FIG. 5 is an explanatory view illustrating the signal path and the DC power supply path for the gate driver IC chip.

An operation of the embodiment having the aforementioned configuration is described hereinbelow by referring to FIG. 5. The gate driver signal 406, which is outputted from the signal processing IC 4, and the DC power, which is supplied to the gate driver IC chips 6, are introduced to the gate driver IC chips 6 through the group of the patterns designated by reference numeral 501 (a group of the patterns designated by reference numerals 51 and 52 in FIG. 4), which are formed on the printed circuit board 5, the group of patterns designated by reference numeral 85 (a group of patterns designated by reference numerals 81 and 82 in FIG. 4), which are formed on the flexible substrate 7*a*, and the group of patterns designated by reference numeral 25 (the group of patterns designated by reference numerals 21 and 22 in FIG. 4), which are formed on the glass substrate 2.

Each of the gate driver IC chips 6 generates and outputs the gate drive signals 602 according to the gate driver signals 406 and the DC power introduced through the aforementioned paths. Then, the gate drive signals 602 outputted from each of the gate driver IC chips 6 is introduced to the gate of the TFT 13 through the pattern (not shown) formed on the glass substrate 2.

That is, the embodiment is configured so that the flexible substrate 99 used in the conventional apparatus is omitted, and that the path for the gate driver signal 406 and the path for the DC power are simplified. Further, in addition, the path for the gate drive signals 602 outputted from the gate driver IC chip 6 is also simplified.

Regarding the power supply pattern 82, the plural unit input pattern portions 901 and the plural unit output pattern portions 902 are assigned to the paths for the DC power. Thus, the impedance of the path for supply DC power to the gate driver IC chip 6 can be set at a sufficiently low value even when occurrence of uneven heating at the thermocompression-bonding using the anisotropic conducive films 1001 and 1002 is prevented by shaping the unit input pattern portions 901, which are electrically connected to the end portions 501 of the printed-circuit-board-side patterns 51 and 52 through the anisotropic conductive film 1001, and the unit output pattern portions 902, which are electrically connected to the end portions 201 of the glass-substrate-side patterns 21 and 22 through the anisotropic conductive film 1002, so that the unit input pattern portions 901 are formed at uniform intervals in such a way as to have the same width, and that the unit output pattern portions 902 are formed at uniform intervals in such a way as to have the same width.

As described above with reference to the embodiment, according to a first aspect of the invention, there is provided a liquid crystal display including: a display panel portion having a glass substrate on which pixel electrodes are formed and on which thin film transistors respectively associated with the pixel electrodes are formed by amorphous silicon; a gate driver IC chip formed by monocrystalline silicon, and in which a gate driver circuit that generates gate drive signals for driving gates of the thin film transistors, is integrated; a source driver IC chip in which a source driver circuit that generates source drive signals for driving sources of the thin film transistors, is integrated; a signal processing IC, in which at least a display controller for generating and outputting gate driver signals that are inputted to the gate driver circuit, and source driver signals that are inputted to said source driver IC chip, is integrated; a printed circuit board on which the signal processing IC is mounted; a flexible substrate on which the source driver IC chip is mounted, the flexible substrate on which a source input pattern to which the source driver signals are inputted, and a source output pattern from which the source drive signals are outputted, are formed, so that an end portion of the source input pattern is connected to the printed circuit board, and that an end portion of the source output pattern is connected to the glass substrate, wherein a gate driver transmission pattern for transmitting gate driver signals that are outputted from the signal processing IC to the glass substrate is formed on the flexible substrate, wherein the gate driver IC chip is COG-mounted on the glass substrate, wherein a unit input pattern portion and a unit output pattern portion are formed on the flexible substrate, the unit input pattern portion electrically connected to a printed-circuit-board-side pattern that is formed on the printed circuit board through an anisotropic conductive film, and the unit output pattern portion electrically connected to a glass-substrate-side pattern that is formed on the glass substrate through an anisotropic conductive film, wherein each of the gate driver transmission patterns is constituted by one unit input pattern portion, one unit output pattern portion, and a connecting pattern portion for connecting the one unit input pattern portion to the one unit output pattern portion, and wherein a power supply pattern serving as a path for DC power inputted to the gate driver circuit is constituted by plural unit input pattern portions, plural unit output pattern portions, and a unit output pattern portion for connecting the plural unit input pattern portions to the plural unit output patter portions.

That is, the signal path for transmitting the gate driver signals to the gate driver IC chip, and the signal paths each for transmitting the gate drive signal to the gate of the thin film transistor can be formed without using the flexible substrate. Further, in a case where the plural unit input pattern portions are used by being parallel-connected to one another, the input impedance of the connection is reduced. In a case where the plural unit output pattern portions are used by being parallel-connected to one another, the output impedance of the connection is reduced.

According to a second aspect of the invention, there is provided a liquid crystal display including: a display panel portion having a glass substrate on which pixel electrodes are formed and on which thin film transistors respectively associated with the pixel electrodes are formed by amorphous silicon; a gate driver IC chip formed by monocrystalline silicon, and in which a gate driver circuit that generates gate drive signals for driving gates of the thin film transistors, is integrated; a source driver IC chip in which a source driver circuit that generates source drive signals for driving sources of the thin film transistors, is integrated; a signal processing IC, in which at least a display controller for generating and outputting gate driver signals that are inputted to the gate driver circuit, and source driver signals that are inputted to said source driver IC chip, is integrated; a printed circuit board on which the signal processing IC is mounted; a flexible substrate on which the source driver IC chip is mounted, the flexible substrate on which a source input pattern to which the source driver signals are inputted, and a source output pattern from which the source drive signals are outputted, are formed, so that an end portion of the source input pattern is connected to the printed circuit board, and that an end portion of the source output pattern is connected to the glass substrate, wherein a gate driver transmission pattern for transmitting gate driver signals that are outputted from the signal processing IC to the glass substrate is formed on the flexible substrate, and wherein the gate driver IC chip is COG-mounted on the glass substrate.

That is, the signal path for transmitting the gate driver signals to the gate driver IC chip, and the signal paths each for transmitting the gate drive signal to the gate of the thin film transistor can be formed without using the flexible substrate.

According to the aspects of the invention, the source driver IC chip is mounted on the flexible substrate on which the source input pattern, to which the source driver signals are inputted, and the source output pattern, from which the source drive signals are outputted, are formed, so that an end portion of the source input pattern is connected to the printed circuit board, and that an end portion of the source output pattern is connected to the glass substrate. Moreover, the gate driver transmission patterns each for transmitting gate driver signals, which are outputted from the signal processing IC, to the glass substrate is formed on the flexible substrate. In this liquid crystal display, the gate driver IC chip formed by using monocrystalline silicon, in which the gate driver circuit is integrated, is COG-mounted on the glass substrate. Furthermore, the unit input pattern portion electrically connected to a printed-circuit-board-side pattern, which is formed on the printed circuit board, through the anisotropic conductive film is formed on the flexible substrate, and the unit output pattern portion electrically connected to the glass-substrate-side pattern, which is formed on the glass substrate, through the anisotropic conductive film is formed thereon. Moreover, each of the gate driver transmission patterns is constituted by the one unit input pattern portion, the one unit output pattern portion, and the connecting pattern portion for connecting the one unit input pattern portion to the one unit output pattern portion. The power supply pattern serving as the path for DC power inputted to the gate driver circuit is constituted by the plural unit input pattern portions, the plural unit output pattern portions, and the unit output pattern portion for connecting the plural unit input pattern portions to the plural unit output patter portions. Therefore, the signal path for transmitting the gate driver signals to the gate driver IC chip, and the signal paths each for transmitting the gate drive signal to the gate of the thin film transistor can be formed without using the flexible substrate. Thus, the connection impedance of the connection using the anisotropic conductive film is reduced. Consequently, the necessity for the flexible substrate, on which the gate driver IC chip is mounted, is eliminated. Also, the signal paths are simplified, so that the rate of occurrence of breaking of the path can be lowered. Additionally, the impedance of the path for supply DC power to the gate driver IC chip can be reduced to a sufficiently low value even in a case where the patterns connected through the anisotropic conductive films to each other are shaped by being formed at uniform intervals in such a way as to have the same width so as to prevent occurrence of uneven heating at the thermocompression-bonding.

Although the present invention has been shown and described with reference to a specific preferred embodiment, various changes and modifications will be apparent to those skilled in the art from the teachings herein. Such changes and modifications as are obvious are deemed to come within the spirit, scope and contemplation of the invention as defined in the appended claims.

What is claimed is:
1. A liquid crystal display comprising:
a display panel portion having a glass substrate on which pixel electrodes are formed and on which thin film transistors respectively associated with the pixel electrodes are formed by amorphous silicon;
a gate driver IC chip formed by monocrystalline silicon, and in which a gate driver circuit that generates gate drive signals for driving gates of the thin film transistors, is integrated;
a source driver IC chip in which a source driver circuit that generates source drive signals for driving sources of the thin film transistors, is integrated;
a signal processing IC, in which at least a display controller for generating and outputting gate driver signals that are inputted to the gate driver circuit, and source driver signals that are inputted to said source driver IC chip, is integrated;
a printed circuit board on which the signal processing IC is mounted;
a flexible substrate on which the source driver IC chip is mounted, the flexible substrate on which a source input pattern to which the source driver signals are inputted, and a source output pattern from which the source drive signals are outputted, are formed, so that an end portion of the source input pattern is connected to the printed circuit board, and that an end portion of the source output pattern is connected to the glass substrate,
wherein a gate driver transmission pattern for transmitting gate driver signals that are outputted from the signal processing IC to the glass substrate is formed on the flexible substrate,
wherein the gate driver IC chip is COG-mounted on the glass substrate,
wherein a unit input pattern portion and a unit output pattern portion are formed on the flexible substrate, the unit input pattern portion electrically connected to a printed-circuit-board-side pattern that is formed on the printed circuit board through an anisotropic conductive film, and the unit output pattern portion electrically connected to a glass-substrate-side pattern that is formed on the glass substrate through an anisotropic conductive film,
wherein each of the gate driver transmission patterns is constituted by one unit input pattern portion, one unit output pattern portion, and a connecting pattern portion for connecting the one unit input pattern portion to the one unit output pattern portion, and
wherein a power supply pattern serving as a path for DC power inputted to the gate driver circuit is constituted by a unit connecting pattern portion having one signal path and formed on the flexible substrate, plural unit input pattern portions connected to the unit connecting pattern portion, and plural unit output pattern portions connected to the unit connecting pattern portion.

* * * * *